US012787334B2

(12) United States Patent
Mu

(10) Patent No.: US 12,787,334 B2
(45) Date of Patent: Nov. 3, 2026

(54) SEMICONDUCTOR DEVICE AND MANUFACTURING METHOD THEREOF

(71) Applicant: CHANGXIN MEMORY TECHNOLOGIES, INC., Hefei City (CN)

(72) Inventor: Kejun Mu, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 784 days.

(21) Appl. No.: 18/164,158

(22) Filed: Feb. 3, 2023

(65) Prior Publication Data

US 2023/0187536 A1 Jun. 15, 2023

Related U.S. Application Data

(63) Continuation of application No. PCT/CN2021/127337, filed on Oct. 29, 2021.

(30) Foreign Application Priority Data

Aug. 16, 2021 (CN) ......................... 202110938731.0

(51) Int. Cl.

| | |
|---|---|
| ***H10D 30/60*** | (2025.01) |
| ***H10D 30/01*** | (2025.01) |
| ***H10D 62/17*** | (2025.01) |

(52) U.S. Cl.

CPC ....... *H10D 30/0281* (2025.01); *H10D 30/601* (2025.01); *H10D 62/371* (2025.01)

(58) Field of Classification Search

CPC ............. H10D 84/0193; H10D 84/853; H10D 30/6728; H10D 30/6733; H10D 30/6735; H10D 62/118; H10D 89/931; H10D 64/252; H10D 84/0188; H10D 84/201; H10D 18/60; H10D 30/62–6219; H10D 30/024–0245; H10D 84/0158; H10D 86/011; H10D 84/834; H10D 86/215; H10D 30/673; H10D 30/689; H10D 30/0323;

(Continued)

(56) References Cited

U.S. PATENT DOCUMENTS 4,523,213 A 6/1985 Konaka
4,885,618 A 12/1989 Schubert (Continued)

FOREIGN PATENT DOCUMENTS

CN 106298542 A 1/2017
CN 106328534 A 1/2017

(Continued)

*Primary Examiner* — Moin M Rahman
(74) *Attorney, Agent, or Firm* — Syncoda LLC; Feng Ma

(57) ABSTRACT

Disclosed is a semiconductor device. The semiconductor device includes: a substrate, including a first surface and a second surface opposite to each other; a gate, located on the first surface of the substrate; a source region located in the substrate on one side of the gate and a drain region located in the substrate another side of the gate; and an anti-punchthrough structure located in the substrate and including a third surface and a fourth surface opposite to each other. The third surface is adjacent to the first surface and (Continued)

lower than the first surface, and the anti-punchthrough structure is located between the source region and the drain region.

9 Claims, 18 Drawing Sheets

(58) Field of Classification Search

CPC ........... H10D 30/6713; H10D 30/6744; H10D 30/6757; H10D 62/021; H10D 64/015; H10D 64/021; H10D 30/60; H10D 62/151; H10D 62/364; H10D 64/017; H10D 30/797; H10D 64/671; H10D 84/0165–0195; H10D 84/85–859; H10D 84/907–994; H10D 30/031; H10D 48/362; H10D 30/472; H10D 30/014; H10D 30/43; H10D 30/01; H10D 62/80; H10D 62/8303; H10D 62/882; H10D 99/00; H10D 62/121; H10D 62/235; H10D 89/10; H10D 84/0128; H10D 84/0167; H10D 84/038; H10D 62/292; H01L 21/76224; H01L 21/31116; H01L 21/30604; H01L 21/3065; H02K 15/027; A23B 2/783; A45C 11/003; A61K 40/4218; H10F 77/955; H10H 20/826; B82Y 10/00; H10B 12/36; H10B 12/056; B81C 2203/0728; B81C 2203/0735; B81C 2203/0742

See application file for complete search history.

(56) References Cited

U.S. PATENT DOCUMENTS

| | | | | |
|---|---|---|---|---|
| 7,057,238 | B2 | 6/2006 | Kim | |
| 7,923,782 | B2 | 4/2011 | Zhu | |
| 2003/0230786 | A1 * | 12/2003 | Kim | H10D 84/0128<br>257/E21.426 |
| 2004/0077148 | A1 * | 4/2004 | Lee | H10B 12/05<br>257/E21.654 |
| 2005/0189589 | A1 | 9/2005 | Zhu | |
| 2006/0160295 | A1 | 7/2006 | Kim | |
| 2016/0268431 | A1 * | 9/2016 | Moll | H10D 30/0275 |

FOREIGN PATENT DOCUMENTS

| | | | |
|---|---|---|---|
| CN | 112908854 | A | 6/2021 |
| JP | H05235345 | A | 9/1993 |

* cited by examiner

SEMICONDUCTOR DEVICE AND MANUFACTURING METHOD THEREOF

CROSS-REFERENCE TO RELATED APPLICATION

This is a continuation application of International Patent Application No. PCT/CN2021/127337, filed on Oct. 29, 2021, which claims priority to Chinese Patent Application No. 202110938731.0, filed on Aug. 16, 2021 and entitled "SEMICONDUCTOR DEVICE AND MANUFACTURING METHOD THEREOF". The disclosures of International Patent Application No. PCT/CN2021/127337 and Chinese Patent Application No. 202110938731.0 are incorporated by reference herein in their entireties.

TECHNICAL FIELD

The disclosure relates to the technical field of semiconductors, and in particular to a semiconductor device and a manufacturing method thereof.

BACKGROUND

With the development of an integrated circuit process technology, the size of a semiconductor device, such as a field effect transistor, is also reduced. A series of secondary physical effects that appear when a length of a channel is reduced to a certain extent are called short channel effects. For example, a depletion area generated in a drain region of a transistor is in contact with or tightly adjacent to an opposite depletion area generated in an opposite source region of the transistor. The punchthrough phenomena of the depletion area can cause charges to move between the source region and the drain region without being affected by the voltage applied to a gate. As a result, the transistor affected by the punchthrough may cause a device to fail to be turned off. Therefore, it is it is desired to seek a semiconductor device capable of resisting the punchthrough.

SUMMARY

An aspect of the disclosure provides a semiconductor device, including a substrate, a gate, a source region, a drain region and an anti-punchthrough structure.

The substrate includes a first surface and a second surface opposite to each other. The gate is located on the first surface of the substrate. The source region is located in the substrate on one side of the gate and the drain region is located in the substrate on another side of the gate. The anti-punchthrough structure is located in the substrate and includes a third surface and a fourth surface opposite to each other. The third surface is adjacent to the first surface and lower than the first surface. The anti-punchthrough structure is located between the source region and the drain region.

Another aspect of the disclosure also provides a method for manufacturing a semiconductor device. The method includes the following operations.

A substrate, including a first surface and a second surface opposite to each other, is provided. An anti-punchthrough structure including a third surface and a fourth surface opposite to each other is formed in the substrate, with the third surface being adjacent to the first surface and lower than the first surface. A gate is formed on the first surface of the substrate. A source region is formed in the substrate on one side of the gate and a drain region is formed in the substrate on another side of the gate, with the anti-punchthrough structure being located between the source region and the drain region.

The disclosure further provides a memory, including the semiconductor device described in any one of the above embodiments.

DETAILED DESCRIPTION

Figure 1A:
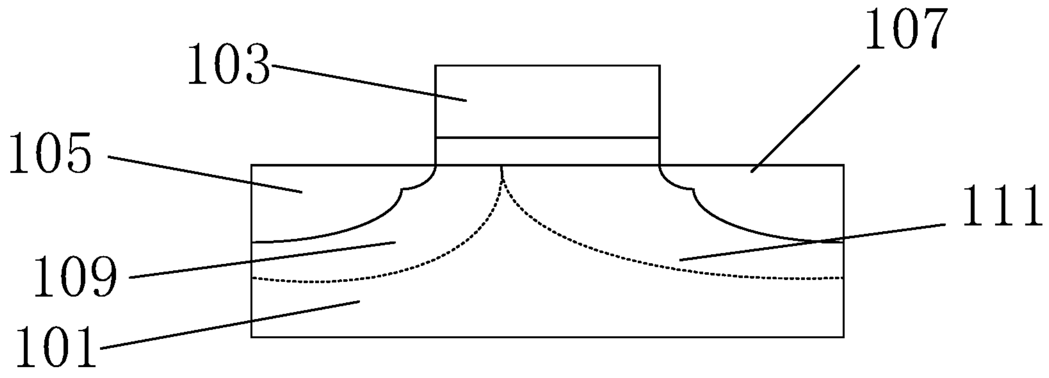
FIG. 1A is a schematic cross-sectional view of a semiconductor device in the related art.

Exemplary embodiments disclosed in the present application are described in more detail with reference to drawings. Although the exemplary embodiments of the disclosure are shown in the drawings, it should be understood that the disclosure may be implemented in various forms and should not be limited by the specific embodiments described here. On the contrary, these embodiments are provided for more thorough understanding of the disclosure, and to fully convey a scope disclosed in the embodiments of the disclosure to a person skilled in the art.

In the following descriptions, a lot of specific details are given in order to provide the more thorough understanding of the disclosure. However, it is apparent to a person skilled in the art that the disclosure may be implemented without one or more of these details. In other examples, in order to avoid confusion with the disclosure, some technical features well-known in the field are not described. Namely, all the features of the actual embodiments are not described here, and well-known functions and structures are not described in detail.

In the drawings, the sizes of a layer, a region, and an element and their relative sizes may be exaggerated for clarity. The same reference sign represents the same element throughout.

It should be understood that while the element or the layer is referred to as being "on", "adjacent to", "connected to" or "coupled to" other elements or layers, it may be directly on the other elements or layers, adjacent to, connected or coupled to the other elements or layers, or an intermediate element or layer may be existent. In contrast, while the element is referred to as being "directly on", "directly adjacent to", "directly connected to" or "directly coupled to" other elements or layers, the intermediate element or layer is not existent. It should be understood that although terms first, second, third and the like may be used to describe various elements, components, regions, layers and/or sections, these elements, components, regions, layers and/or sections should not be limited by these terms. These terms are only used to distinguish one element, component, region, layer or section from another element, component, region, layer or section. Therefore, without departing from the teaching of the disclosure, a first element, component, region, layer or section discussed below may be represented as a second element, component, region, layer or section. While the second element, component, region, layer or section is discussed, it does not mean that the first element, component, region, layer or section is necessarily existent in the disclosure.

Spatial relation terms, such as "under", "below", "lower", "underneath", "above", "upper" and the like, may be used here for conveniently describing so that a relationship between one element or feature shown in the drawings and other elements or features is described. It should be understood that in addition to orientations shown in the drawings, the spatial relationship terms are intended to further include the different orientations of a device in use and operation. For example, if the device in the drawings is turned over, then the elements or the features described as "below" or "underneath" or "under" other elements may be oriented "on" the other elements or features. Therefore, the exemplary terms "below" and "under" may include two orientations of up and down. The device may be otherwise oriented (rotated by 90 degrees or other orientations) and the spatial descriptions used here are interpreted accordingly.

A purpose of the terms used here is only to describe the specific embodiments and not as limitation to the disclosure. While used here, singular forms of "a", "an" and "said/the" are also intended to include plural forms, unless the context clearly indicates another mode. It should also be understood that terms "composition" and/or "including", while used in the description, determine the existence of the described features, integers, steps, operations, elements and/or components, but do not exclude the existence or addition of one or more other features, integers, steps, operations, elements, components, and/or groups. As used herein, a term "and/or" includes any and all combinations of related items listed.

In order to understand the disclosure thoroughly, detailed steps and detailed structures are presented in the following description, so as to explain the technical solutions of the disclosure. Preferred embodiments of the disclosure are described in detail below, however, the disclosure may also have other implementations in addition to these detailed descriptions.

Figure 1B:
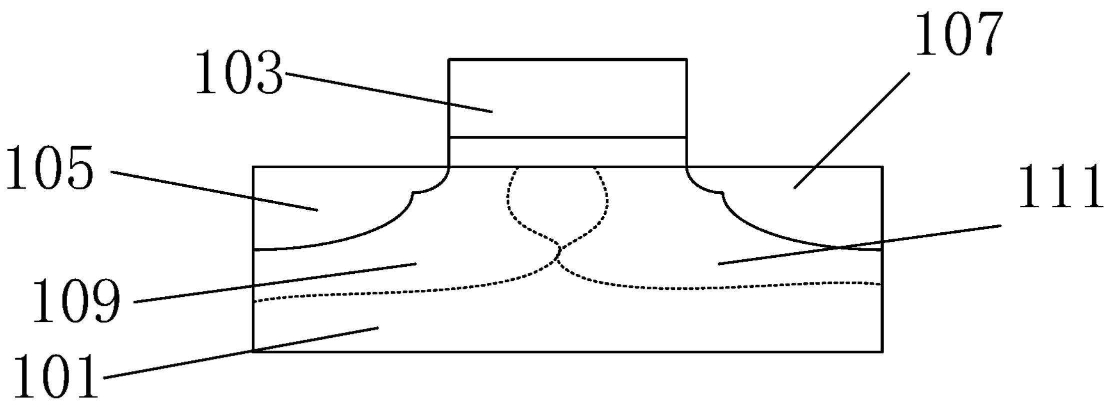
FIG. 1B is a schematic cross-sectional view of a semiconductor device in the related art.
Figure 1C:
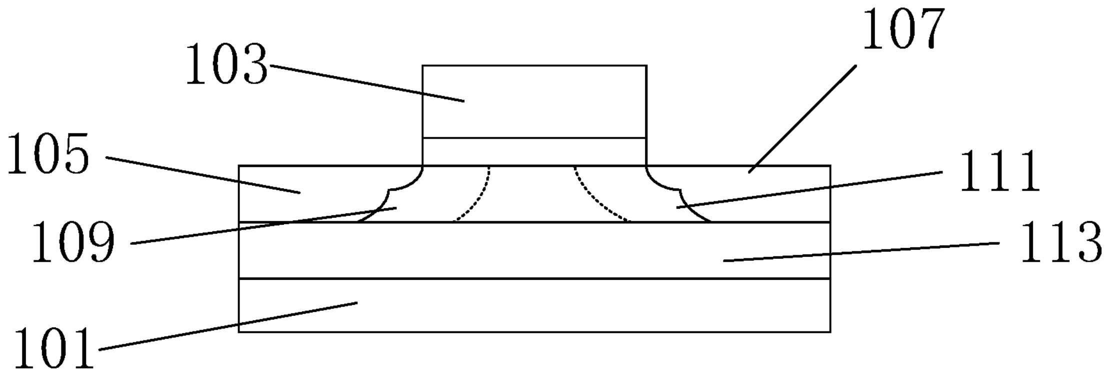
FIG. 1C is a schematic cross-sectional view of a semiconductor device in the related art.

FIG. 1A is a schematic cross-sectional view of a semiconductor device in the related art. The semiconductor device includes: a substrate 101; a gate 103 located on the substrate; and a source region 105 located in the substrate on one side of the gate and a drain region 107 located in the substrate on another side of the gate. With the increasing development of an integrated circuit process technology, the size of a device is also reduced. As shown in FIG. 1A, depletion layers of the source region and drain region tend to approach to one another. When a voltage is applied to a drain, a drain depletion layer 111 is widened and gradually merged with a source depletion layer 109, resulting in severe surface punchthrough current. Currently, an improvement method used in the related art is to implant more Channel Ion Implantation (IMP) in a surface area of a channel to decrease a width of the surface depletion layer. However, if a length of the channel further reduces, there is also the risk that the depletion layers under the source and drain regions may be in contact with one another, which results in a body punchthrough current, as shown in FIG. 1B. If more well IMP is injected here, problems of the body effect, the well isolation and the latch up effect may occur, so that other more advanced improvement means are desired. As shown in FIG. 1C, a silicon on isolation (SOI) structure has a thin silicon layer, and an intermediate oxide layer 113 can interrupt the depletion layers, so that punchthrough leakage can be effectively reduced. However, the structure is complex, which cannot be compatible with general semiconductor devices such as a Dynamic Random Access Memory (DRAM).

Figure 2:
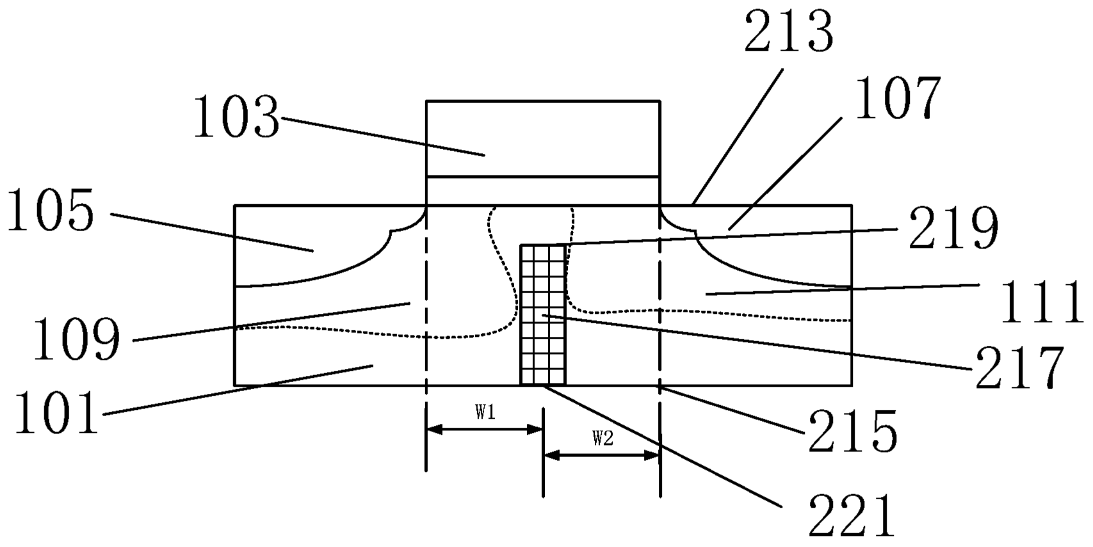
FIG. 2 is a schematic cross-sectional view of a semiconductor device according to an embodiment of the disclosure.

Based on this, an embodiment of the disclosure provides a semiconductor device. FIG. 2 is a schematic cross-sectional view of a semiconductor device according to an embodiment of the disclosure. Referring to FIG. 2, the semiconductor device includes: a substrate 101, a gate 103, a source region 105, a drain region 107 and an anti-punchthrough structure 217. The substrate includes a first surface 213 and a second surface 215 opposite to each other. The gate 103 is located on the first surface 213 of the substrate 101. The source region 105 is located in the substrate 101 on one side of the gate 103 and the drain region 107 located in the substrate 101 on another side of the gate 103. The anti-punchthrough structure 217 is located in the substrate and includes a third surface 219 and a fourth surface 221 opposite to each other. The third surface 219 is adjacent to the first surface 213 and lower than the first surface 213. The anti-punchthrough structure 217 is located between the source region 105 and the drain region 107. The anti-punchthrough structure 217 can block the horizontal extension of a drain depletion layer 111 and a source depletion layer 109. Therefore, by disposing the anti-punchthrough structure between the source region and the drain region in the substrate, the impact of short channel effects can be reduced or prevented, thereby improving the performance of the device.

The substrate 101 may be silicon, silicon germanium, germanium, or other suitable semiconductor. The source region 105 and the drain region 107 may form an N-type doped region by doping n-type dopants such as phosphorus, arsenic, other n-type dopants or combinations thereof, and may form a P-type doped region by doping p-type dopants such as boron, indium, other p-type dopants or combinations thereof. The source region 105 and the drain region 107 may further include a Lightly Doped Drain (LDD) and a Halo implant area. The gate 103 includes a gate dielectric layer and a gate metal layer. For example, the gate dielectric layer may be silicon oxynitride, silicon oxide, or a high K material; and the gate metal layer may be polysilicon, metal tungsten and titanium nitride.

In an embodiment, a distance between the third surface 219 of the anti-punchthrough structure 217 and the first surface 213 of the substrate 101 is greater than 50 angstroms. In this case, the anti-punchthrough structure 217 can block the most of the lateral extension of the drain depletion layer 111 and the source depletion layer 109 without greatly affecting the formation of the channel.

In an embodiment, the fourth surface 221 of the anti-punchthrough structure 217 is flush with the second surface 215 of the substrate 101. If the fourth surface 221 is higher than the second surface 215, the drain depletion layer 111 and the source depletion layer 109 may bypass the anti-punchthrough structure 217 by extending below the fourth surface 221 of the anti-punchthrough structure 217, which results in the undesirable electric leakage. Therefore, in the present disclosure, the depletion layer can be effectively prevented from bypassing the fourth surface of the anti-punchthrough structure, so as to avoid a punchthrough effect.

In an embodiment, a material of the anti-punchthrough structure 217 may include an insulation material such as silicon dioxide ($SiO_2$), silicon nitride and silicon oxynitride.

In an embodiment, an expansion coefficient of the anti-punchthrough structure 217 is less than an expansion coefficient of the substrate 101; and/or an elastic modulus of the anti-punchthrough structure 217 is greater than an elastic modulus of the substrate 101. Therefore, by selecting the proper material for the anti-punchthrough structure, the stress effect caused by the anti-punchthrough structure can be minimized.

Although not shown in the figure, when a plurality of semiconductor devices in the embodiments of the disclosure are provided, Shallow Trench Isolation (STI) may be provided between the plurality of semiconductor devices.

In some embodiments of the disclosure, as shown in FIG. 2, the anti-punchthrough structure 217 is located below the gate 103. A distance W1 between the anti-punchthrough structure 217 and the source region 105 is equal to a distance W2 between the anti-punchthrough structure 217 and the drain region 107. Compared with the offset anti-punchthrough structure (i.e. the anti-punchthrough structure closer to one of the source region and the drain region), the anti-punchthrough structure in the center of the device would not affect the trend of the depletion layer, and achieve an effect of preventing punchthrough. In addition, by the anti-punchthrough structure in the center of the device, the overall stress distribution of the device can be uniform.

Figure 3A:
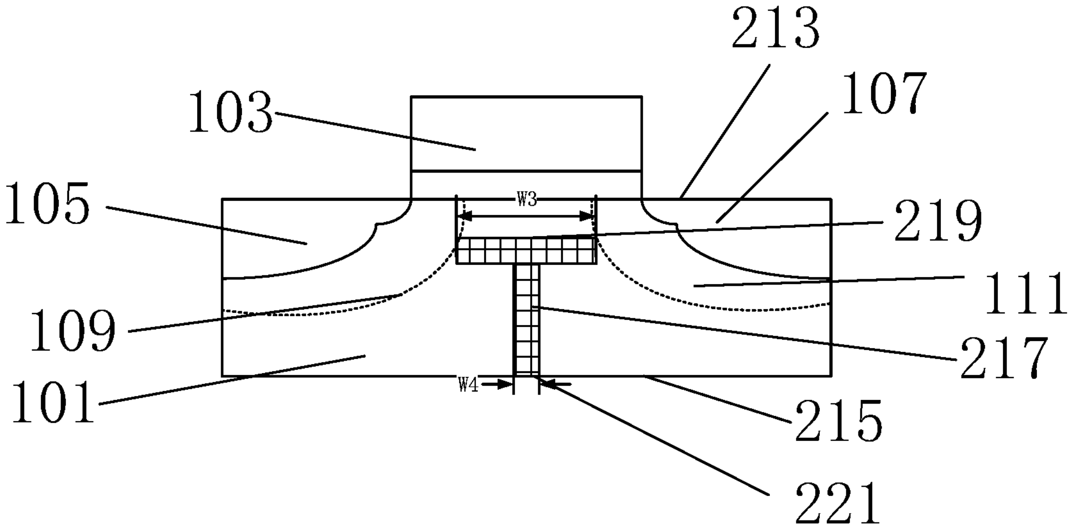
FIG. 3A to FIG. 3B are schematic cross-sectional views of a semiconductor device according to another embodiment of the disclosure.

In some embodiments of the disclosure, as shown in FIG. 3A, the anti-punchthrough structure 217 is T-shaped. A width W3 of the third surface 219 of the anti-punchthrough structure 217 is greater than a width W4 of the fourth surface 221. Due to increased device integration and shortened channel length, in the anti-punchthrough structure with a constant width, the source depletion layer and the drain depletion layer may bypass the anti-punchthrough structure and contact each other at an area above the anti-punchthrough structure, which results in the punchthrough effect. The T-shaped structure may greatly reduce the probability that the depletion layers bypass the third surface of the anti-punchthrough structure, so that the reliability of the device can be improved.

Figure 3B:
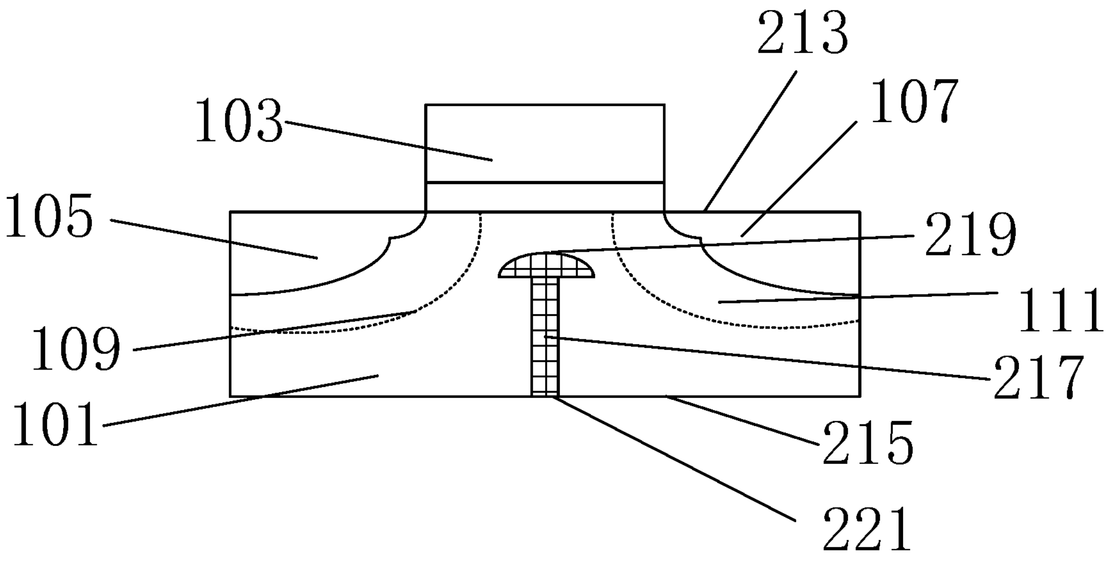

In the above examples, the third surface 219 of the anti-punchthrough structure is parallel to the surface of the substrate. However, the above solution is merely an example of the present disclosure, and it should be understood that other structures may be used in the disclosure, and should not be limited by the specific example set forth herein. For example, as shown in FIG. 3B, the third surface 219 of the anti-punchthrough structure may have a circular arc shape recessed toward the gate. Therefore, the filling of the insulation material is facilitated, a filling process is simplified, and production cost is reduced.

Figure 4:
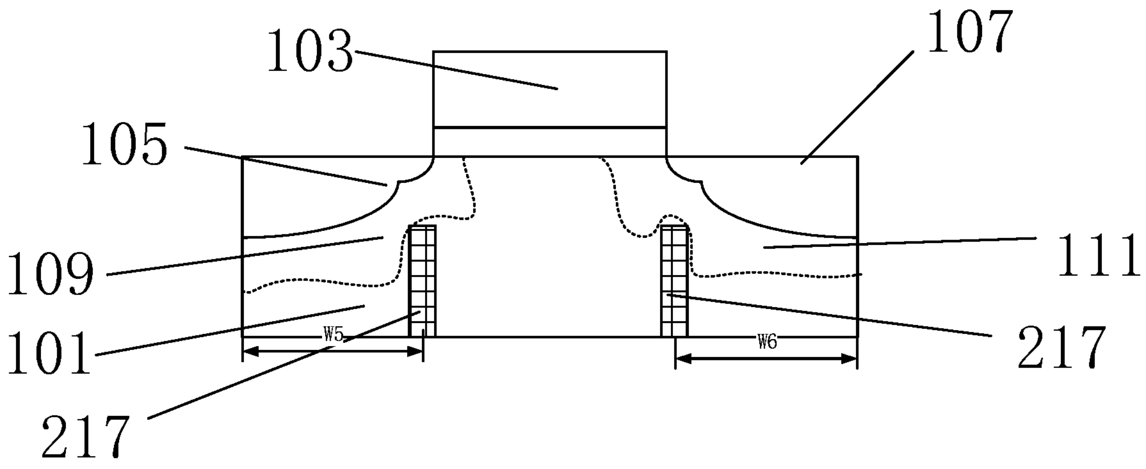
FIG. 4 is a schematic cross-sectional view of a semiconductor device according to another embodiment of the disclosure.

In some embodiments of the disclosure, as shown in FIG. 4, the semiconductor device includes two anti-punchthrough structures 217. The two anti-punchthrough structures 217 are located below the gate 103. A distance W5 between the anti-punchthrough structure 217 adjacent to the source region 105 and the source region 105 is equal to a distance W6 between the anti-punchthrough structure 217 adjacent to the drain region 107 and the drain region 107. Since the disposed T-shaped anti-punchthrough structure is complex in structure while the single anti-punchthrough structure had limited success as a means of blocking the punchthrough of the depletion layer. The embodiments of the disclosure provide for each of the source and the drain the anti-punchthrough structure 217. The anti-punchthrough structure 217 adjacent to the source region 105 may block the source depletion layer 109 from extending to the drain, and the anti-punchthrough structure 217 adjacent to the drain region 107 may block the drain depletion layer 111 from extending to the source, so that the body punchthrough effect of a short-channel device can be effectively reduced.

Figure 5:
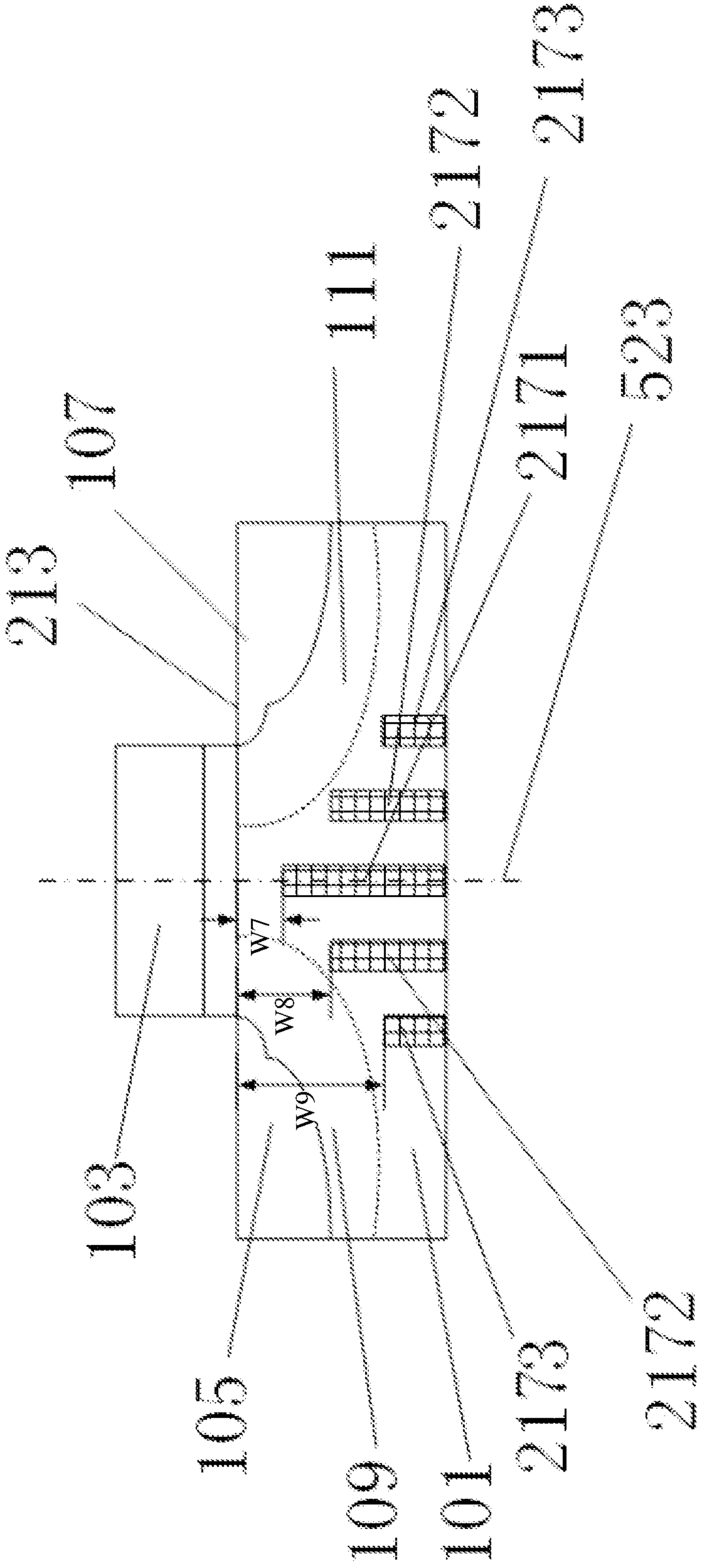
FIG. 5 is a schematic cross-sectional view of a semiconductor device according to another embodiment of the disclosure.

In some embodiments of the disclosure, as shown in FIG. 5, the semiconductor device includes a plurality of anti-punchthrough structures. The plurality of anti-punchthrough structures are symmetrically distributed with respect to a central axis 523 of the gate, and distances between the anti-punchthrough structures and the first surface 213 successively increase in a direction from the central axis 523 to the source region or the drain region (that is, the anti-punchthrough structure farthest from the central axis has a maximum distance from the first surface, and vice versa).

As shown in FIG. 5, five anti-punchthrough structures are provided as an example to specifically describe the above solution. The five anti-punchthrough structures are symmetrically distributed with respect to the central axis 523 of the gate. The anti-punchthrough structure 2171 is located on the central axis 523, and a distance between the anti-punchthrough structure 2171 and the first surface 213 is W7. The anti-punchthrough structures 2172 are symmetrically distributed on two sides of the anti-punchthrough structure 2171, and a distance between each anti-punchthrough structure 2172 and the first surface 213 is W8. The anti-punchthrough structures 2173 are symmetrically distributed on two outermost sides of the anti-punchthrough structure 2171, and a distance between the anti-punchthrough structure 2173 and the first surface 213 is W9. The distances between the anti-punchthrough structures and the first surface 213 successively increase in the direction from the central axis 523 to the source region or the drain region, that is, W7<W8<W9. Although the punchthrough of the depletion layer may be effectively inhibited by arranging the anti-punchthrough structures respectively adjacent to the source and the drain, such structure forcibly changes the trend of the depletion layer, while a physical model requires this area to balance the charges. This embodiment of the disclosure realizes the effect of preventing punchthrough without affecting the depletion layer area as much as possible. For example, with the gradual widening of the source depletion layer 109, the anti-punchthrough structures 2173 disposed on the outermost sides play a role of hindering the extension of the source depletion layer at first, so as to delay migration of the depletion layer in a direction toward the drain. With further widening of the source depletion layer 109, the anti-punchthrough structures 2172 play a role of further hindering the extension of the depletion layer, so that the depletion layer can be blocked from bypassing the central anti-punchthrough structure 2171 from the area above the central anti-punchthrough structure.

Figure 6:
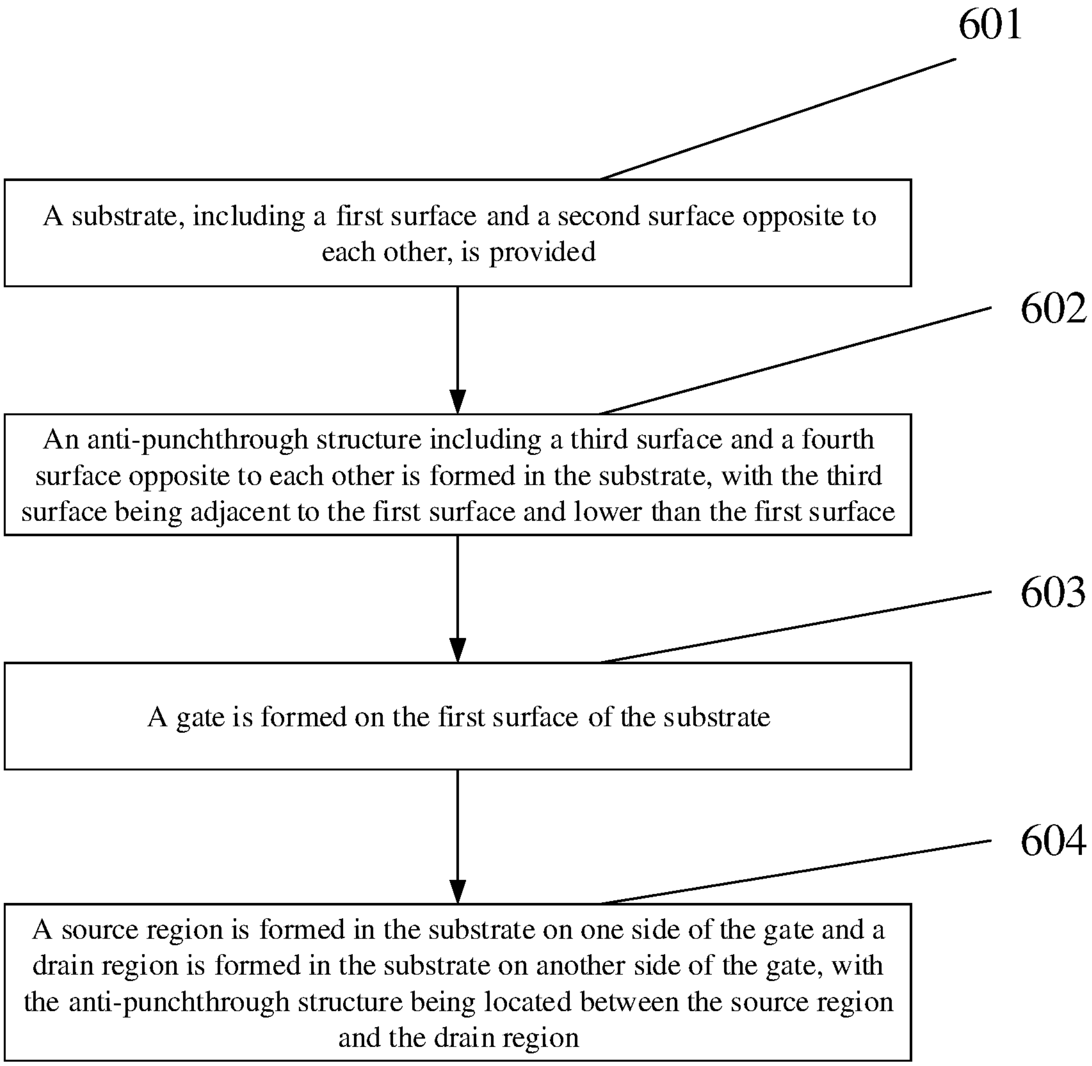
FIG. 6 is a flowchart of a method for manufacturing a semiconductor device according to an embodiment of the disclosure.

An embodiment of the disclosure further provides a method for manufacturing a semiconductor device. Referring to FIG. 6 for details, as shown in the figure, the method includes the following operations.

At S601, a substrate is provided, and the substrate includes a first surface and a second surface opposite to each other.

At S602, an anti-punchthrough structure is formed in the substrate. The anti-punchthrough structure includes a third surface and a fourth surface opposite to each other, and the third surface is adjacent to the first surface and lower than the first surface.

At S603, a gate is formed on the first surface of the substrate.

At S604, a source region is formed in the substrate on one side of the gate and a drain region is formed in the substrate on another side of the gate. The anti-punchthrough structure is located between the source region and the drain region.

The method for manufacturing a semiconductor device provided in the embodiments of the disclosure is further described in detail below with reference to specific embodiments.

FIG. 7A to FIG. 7D are schematic views of a device structure of a semiconductor device during manufacturing according to an embodiment of the disclosure.

Figure 7A:
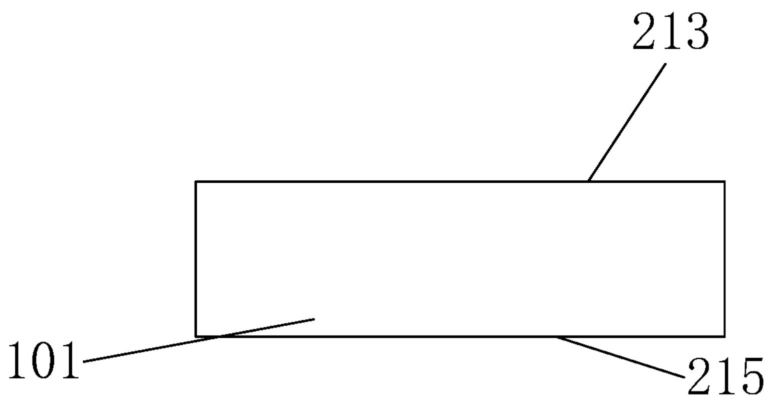
FIG. 7A to FIG. 7D are schematic diagrams of a device structure of a semiconductor device during manufacturing according to an embodiment of the disclosure.

Firstly, S601 is performed. As shown in FIG. 7A, the substrate 101 including the first surface 213 and the second surface 215 opposite to each other is provided. The substrate 101 may be silicon, silicon germanium, germanium, or other suitable semiconductor materials.

Figure 7B:
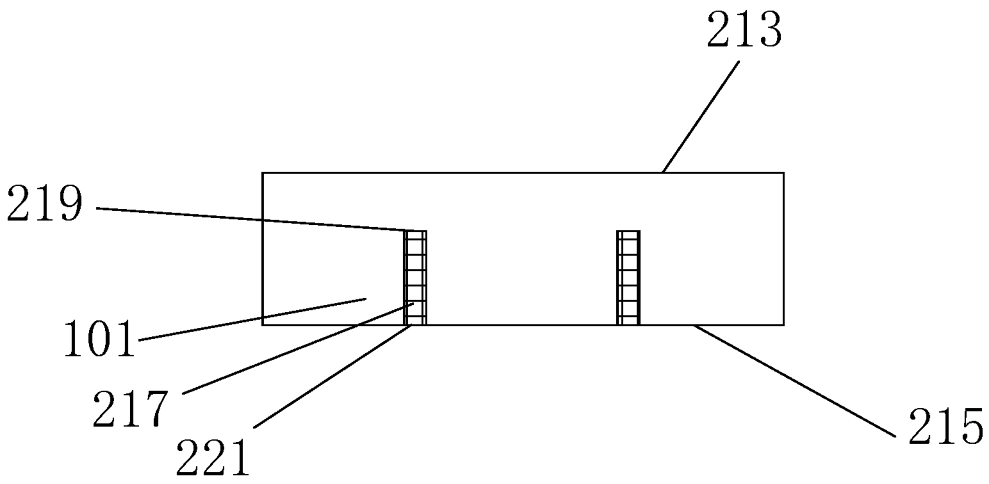

Next, referring to FIG. 7B, S602 is performed, the anti-punchthrough structure 217 is formed in the substrate 101. The anti-punchthrough structure 217 includes the third surface 219 and the fourth surface 221 opposite to each other, and the third surface 219 is adjacent to the first surface 213 and lower than the first surface 213.

Figure 8A:
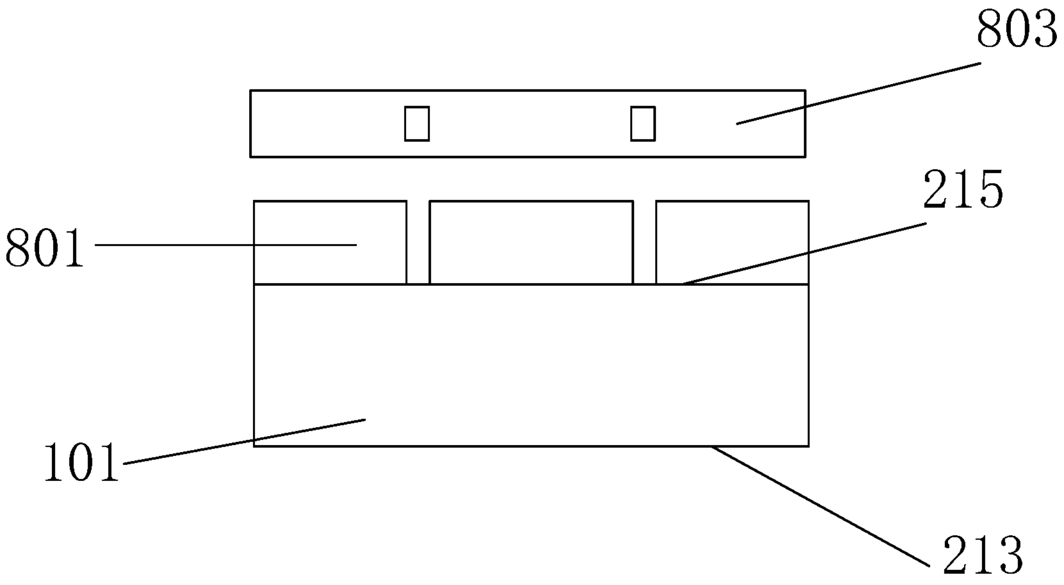
FIG. 8A to FIG. 8C are schematic diagrams of a device structure of a semiconductor device during manufacturing according to an embodiment of the disclosure.
Figure 8B:
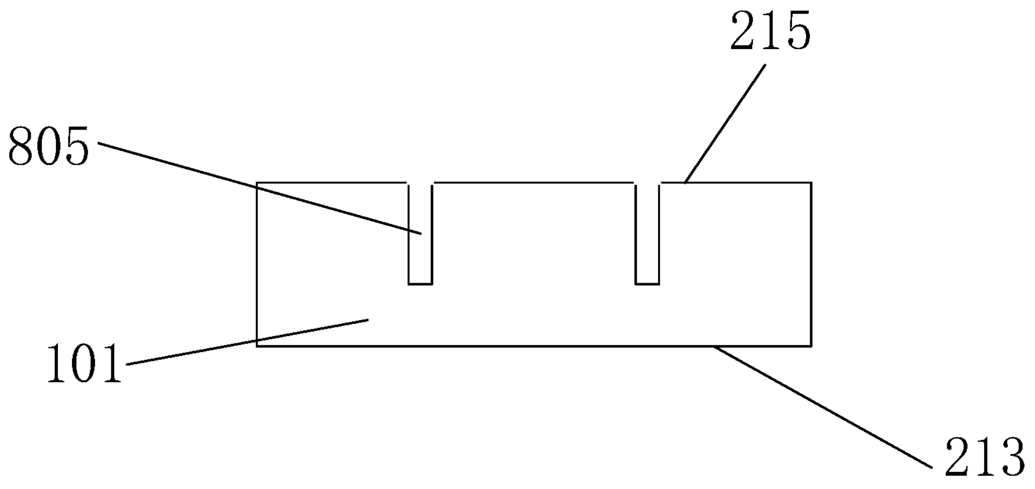
Figure 8C:
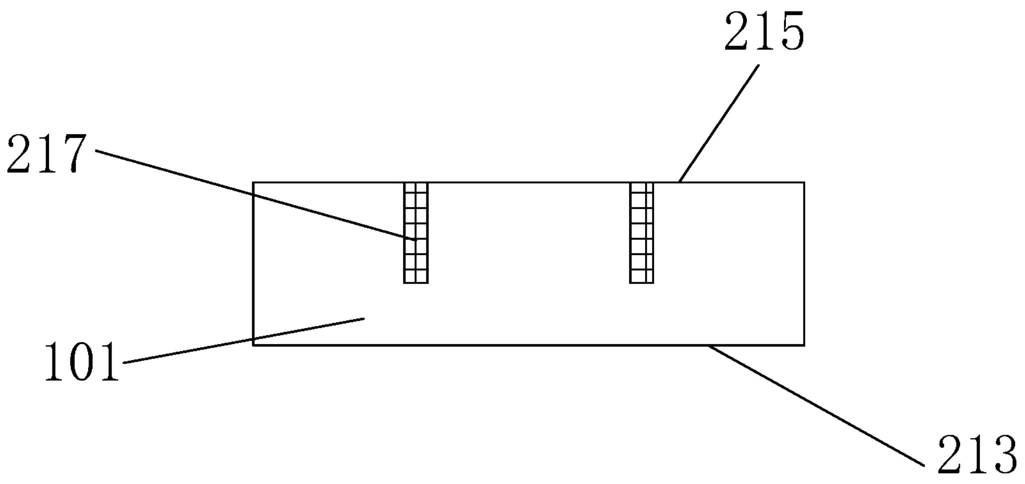

As shown in FIG. 8A to FIG. 8C, the operation of forming the anti-punchthrough structure 217 in the substrate 101 includes: forming a patterned mask layer 801 on the second surface 215 of the substrate 101 with an area on the substrate 101 being exposed from the mask layer 801; etching the substrate 101 by using the patterned mask layer 801 as a mask, to form an opening 805; and filling an insulation material in the opening 805 to form the anti-punchthrough structure.

Specifically, as shown in FIG. 8A, the substrate 101 is turned over at first, then the mask layer 801 is formed on the second surface 215 of the substrate 101; and then, the mask layer 801 is patterned by a reticle 803, to form a shape corresponding to a pattern to be etched. The mask layer 801 may be patterned by means of photolithography. For example, the mask layer 801 is patterned by means of exposure, development and degumming.

Next, referring to FIG. 8B, the substrate 101 is etched by using the patterned mask layer 801 as the mask, and the opening 805 with a certain depth is etched according to a shape of a groove to be etched. Herein, for example, the opening 805 may be formed by means of a wet or dry etching process. In one example, a distance between a bottom surface of the opening 805 and the first surface 213 of the substrate 101 is greater than 50 angstroms.

Then, referring to FIG. 8C, the insulation material is filled in the opening 805 to form the anti-punchthrough structure 217. The insulation material may include $SiO_2$, silicon nitride, silicon oxynitride, or the like. For example, Chemical Mechanical Polishing (CMP) is performed after the $SiO_2$ is deposited, to remove the $SiO_2$ deposited on the surface of the substrate.

Figure 7C:
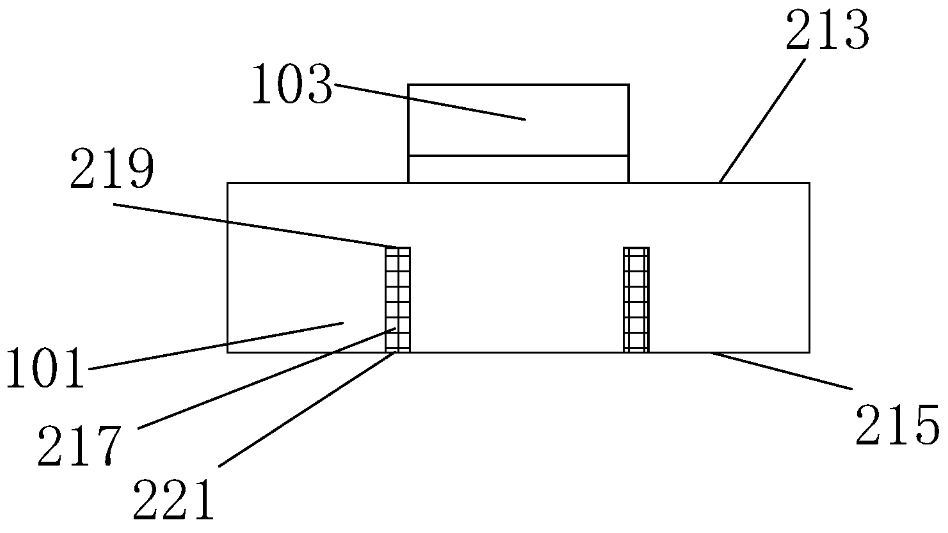

Next, referring to FIG. 7C, S603 is performed, and the gate 103 is formed on the first surface 213 of the substrate. The gate 103 includes a gate dielectric layer and a gate metal layer. For example, the gate dielectric layer may be silicon oxynitride, silicon oxide, or a high K material; and the gate metal layer may be polysilicon, metal tungsten or titanium nitride.

In an embodiment, an expansion coefficient of the anti-punchthrough structure is less than an expansion coefficient of the substrate; and/or an elastic modulus of the anti-punchthrough structure is greater than an elastic modulus of the substrate. Therefore, by selecting the proper material of the anti-punchthrough structure, the stress effect caused by the anti-punchthrough structure can be minimized.

Figure 7D:
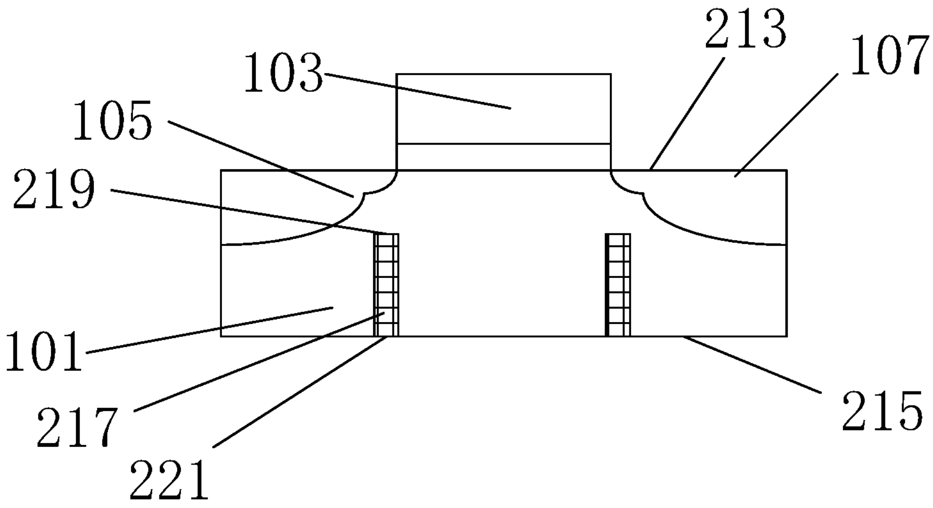

Finally, referring to FIG. 7D, S604 is performed. The source region 105 is formed in the substrate 101 on one side of the gate 103 and the drain region 107 is formed in the substrate 101 on another side of the gate 103. The anti-punchthrough structure 217 is located between the source region 105 and the drain region 107.

Therefore, by disposing the anti-punchthrough structure between the source region and the drain region in the substrate, the impact of short channel effects can be reduced or prevented, thereby improving the performance of the device. The source region 105 and the drain region 107 may form an N-type doped region by doping n-type dopants such as phosphorus and arsenic and n-type dopants of combinations thereof, and may form a P-type doped region by doping p-type dopants such as boron, indium, other p-type dopants or combinations thereof. The source region and the drain region may further include an LDD and a Halo implant area.

Although not shown in the figure, when a plurality of semiconductor devices in the embodiments of the disclosure are manufactured, STI may be provided between the semiconductor devices.

In an embodiment, the fourth surface 221 of the anti-punchthrough structure 217 is flush with the second surface 215 of the substrate 217.

In some embodiments of the disclosure, the anti-punchthrough structure is located below the gate. A distance between the anti-punchthrough structure and the source region is equal to a distance between the anti-punchthrough structure and the drain region.

Figure 9A:
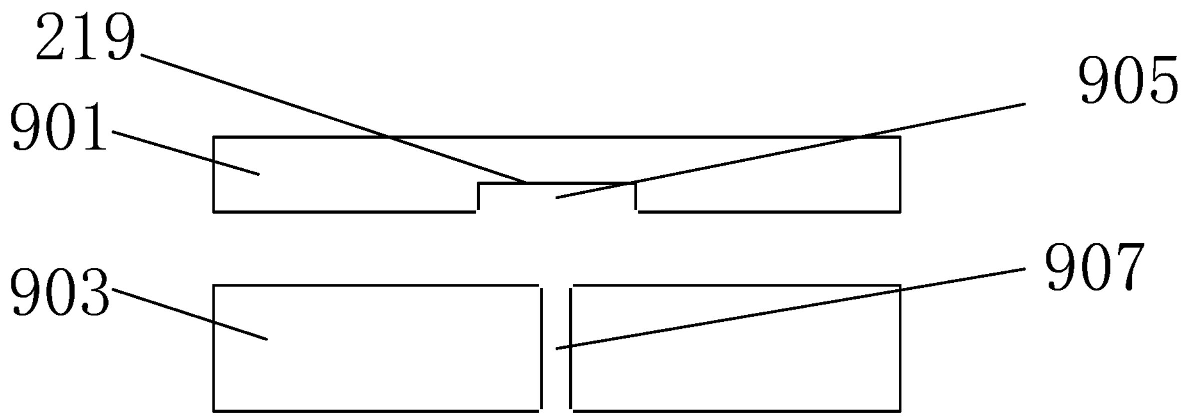
FIG. 9A to FIG. 9B are schematic diagrams of a device structure of a semiconductor device during manufacturing according to an embodiment of the disclosure.
Figure 9B:
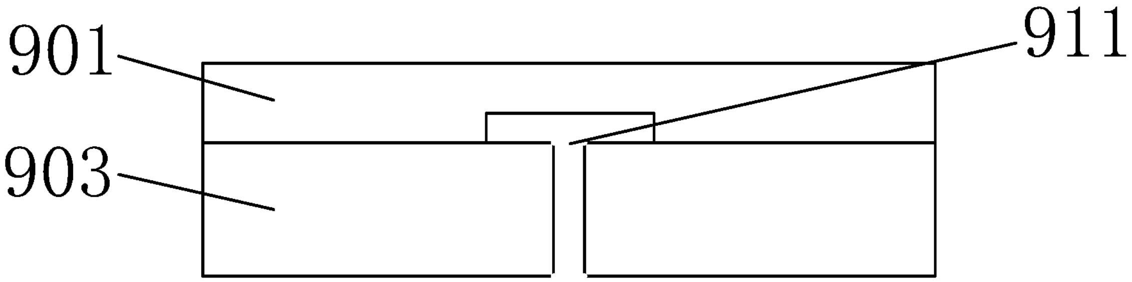

In another embodiment, the anti-punchthrough structure is T-shaped. The width of the third surface of the anti-punchthrough structure is greater than the width of the fourth surface. As shown in FIG. 9A, a first substrate 901 and a second substrate 903 may be provided. A first groove 905 is formed in the first substrate 901. The third surface 219 of the T-shaped anti-punchthrough structure is formed at the bottom of the first groove 905. A second groove 907 is formed in the second substrate 903, and the second groove passes through the second substrate 903. As shown in FIG. 9B, the first substrate 901 is bonded to the second substrate 903. A T-shaped opening 911 is formed by the first groove 905 and the second groove 907. Then, the insulation material is filled in the T-shaped opening 911 to form the anti-punchthrough structure. In some preferred embodiments, a bottom surface of the first groove 905 may be a circular arc surface, and an upper surface of the finally obtained T-shaped anti-punchthrough structure may be a circular arc surface.

In another embodiment, the semiconductor device includes two anti-punchthrough structures. The two anti-punchthrough structures are located below the gate. A distance between the anti-punchthrough structure adjacent to the source region and the source region is equal to a distance between the anti-punchthrough structure adjacent to the drain region and the drain region.

In some embodiments of the disclosure, the semiconductor device includes a plurality of anti-punchthrough structures. The plurality of anti-punchthrough structures are symmetrically distributed with respect to a central axis of the gate, and distances between the anti-punchthrough structures and the first surface successively increase in a direction from the central axis to the source region or the drain region (that is, the anti-punchthrough structure farthest from the central axis has a maximum distance from the first surface, and vice versa). In one example, mask etching may be performed for a plurality of times. By controlling the etching time, the openings with different depths that successively decrease in a direction from the central axis to the source region or the drain region are obtained. Next, the insulation material is filled in the opening to form the anti-punchthrough structure.

An embodiment of the disclosure further provides a memory including the semiconductor device described in the above solution. The memory may be a computing memory (for example, DRAM, SRAM, DDR3SDRAM, DDR2SDRAM, DDRSDRAM, and the like), a consumption type memory (for example, DDR3SDRAM, DDR2SDRAM, DDRSDRAM, SDRSDRAM, and the like), a graphic memory (for example, DDR3SDRAM, GDDR3SDMRA, GDDR4SDRAM, GDDR5SDRAM, and the like), or a mobile memory. For the beneficial effects of the memory, please refer to the above description of the semiconductor device and the manufacturing method thereof, which are not described herein.

In conclusion, the anti-punchthrough structure may block the horizontal extension of the drain depletion layer and the source depletion layer. By disposing the anti-punchthrough structure between the source region and the drain region in the substrate, the impact of short channel effects can be reduced or prevented, thereby improving the performance of the device.

It is to be noted that, the semiconductor device and the manufacturing method therefor can be applied to any integrated circuit including such structure. The technical features in the technical solutions described in the embodiments may be arbitrarily combined without conflict.

The above are only preferred embodiments of the disclosure, and are not used to limit the scope of protection of the disclosure. Any modifications, equivalent replacements and improvements and the like made within the spirit and principle of the disclosure shall be included within the scope of protection of the disclosure.

INDUSTRIAL APPLICABILITY

The semiconductor device provided in the embodiments of the disclosure includes: a gate, a source region, a drain region and an anti-punchthrough structure. The substrate includes the first surface and the second surface opposite to each other. The gate is located on the first surface of the substrate. The source region is located in the substrate on one side of the gate and the drain region located in the substrate on another side of the gate. The anti-punchthrough structure is located in the substrate and includes the third surface and the fourth surface opposite to each other. The third surface is adjacent to the first surface and lower than the first surface, and the anti-punchthrough structure is located between the source region and the drain region. Therefore, by disposing the anti-punchthrough structure between the source region and the drain region in the substrate, the impact of short channel effects can be reduced or prevented, thereby improving the performance of the device.

The invention claimed is:

1. A semiconductor device, comprising:

a substrate, comprising a first surface and a second surface opposite to each other; a gate, located on the first surface of the substrate;

a source region and a drain region, the source region being located in the substrate on one side of the gate, and the drain region being located in the substrate on another side of the gate; and at least one anti-punchthrough structure, located in the substrate and comprising a third surface and a fourth surface opposite to each other, wherein the third surface is adjacent to the first surface and lower than the first surface, and the anti-punchthrough structure is located between the source region and the drain region;

wherein the semiconductor device comprises two anti-punchthrough structures, each of the two anti-punchthrough structures is located below the gate, wherein a distance between the anti-punchthrough structure adjacent to the source region and the source region is equal to a distance between the anti-punchthrough structure adjacent to the drain region and the drain region, wherein the anti-punchthrough structure is T-shaped;

and a width of the third surface of the anti-punchthrough structure is greater than a width of the fourth surface.

2. The semiconductor device of claim 1, wherein the semiconductor device comprises a plurality of anti-punchthrough structures, the plurality of anti-punchthrough structures are symmetrically distributed with respect to a central axis of the gate, wherein distances between the anti-punchthrough structures and the first surface successively increase in a direction from the central axis to the source region or the drain region.

3. The semiconductor device of claim 1, wherein a distance between the third surface of the anti-punchthrough structure and the first surface of the substrate is greater than 50 angstroms.

4. The semiconductor device of claim 1, wherein a material of the anti-punchthrough structure comprises an insulation material.

5. A method for manufacturing a semiconductor device, comprising: providing a substrate comprising a first surface and a second surface opposite to each other;

forming, an anti-punchthrough structure comprising a third surface and a fourth surface opposite to each other, in the substrate, wherein the third surface is adjacent to the first surface and lower than the first surface;

forming a gate on the first surface of the substrate; and forming a source region on one side of the gate and forming a drain region in the substrate on another side of the gate, with the anti-punchthrough structure being located between the source region and the drain region;

wherein the forming an anti-punchthrough structure in the substrate comprises:

forming two anti-punchthrough structures in the substrate, with each of the two anti-punchthrough structure being located below the gate, and a distance between the anti-punchthrough structure adjacent to the source region and the source region being equal to a distance between the anti-punchthrough structure adjacent to the drain region and the drain region, wherein the anti-punchthrough structure is T-shaped; and a width of the third surface of the anti-punchthrough structure is greater than a width of the fourth surface.

6. The method for manufacturing of claim 5, wherein the forming an anti-punchthrough structure in the substrate comprises:

forming a patterned mask layer on the second surface of the substrate, with an area on the substrate being exposed from the mask layer;

etching the substrate by using the patterned mask layer as a mask, to form an opening; and filling an insulation material in the opening to form the anti-punchthrough structure.

7. The method for manufacturing of claim 5, wherein the forming an anti-punchthrough structure in the substrate comprises:

forming a plurality of anti-punchthrough structures in the substrate, with the plurality of anti-punchthrough structures being symmetrically distributed with respect to a central axis of the gate, and distances between the anti-punchthrough structures and the first surface successively increasing in a direction from the central axis to the source region or the drain region.

8. The method for manufacturing of claim 5, wherein a distance between the third surface of the anti-punchthrough structure and the first surface of the substrate is greater than 50 angstroms.

9. A memory, comprising the semiconductor device of claim 1.

* * * * *